United States Patent
Krispin et al.

(10) Patent No.: US 6,899,406 B2
(45) Date of Patent: May 31, 2005

(54) HOUSING FOR A TELECOMMUNICATIONS SYSTEM

(75) Inventors: Harro Krispin, Berlin (DE); Manfred Klingbeil, Berlin (DE); Katharina Krämer, Berlin (DE); Peter Pütz, Berlin (DE); Jürgen Schulz, Berlin (DE)

(73) Assignee: DeTeWe AG & Co., Berlin (DE)

( * ) Notice: Subject to any disclaimer, the term of this patent is extended or adjusted under 35 U.S.C. 154(b) by 0 days.

(21) Appl. No.: 10/012,162

(22) Filed: Oct. 26, 2001

(65) Prior Publication Data

US 2002/0050771 A1 May 2, 2002

(30) Foreign Application Priority Data

Oct. 26, 2000 (DE) .................................... 200 18 740 U

(51) Int. Cl.[7] .................... A47B 81/00; A47G 29/00; H02B 1/00
(52) U.S. Cl. ................. 312/223.2; 312/100; 312/265.5; 361/600
(58) Field of Search .................. 312/100, 101, 312/236, 257.1, 263, 265.5, 223.1, 265.6, 223.2; 361/600, 725, 687, 724

(56) References Cited

U.S. PATENT DOCUMENTS

| 5,119,270 A | * | 6/1992 | Bolton et al. ............... 361/687 |
| 5,162,976 A | * | 11/1992 | Moore et al. ............... 361/683 |
| 5,297,004 A | * | 3/1994 | Mazura ...................... 361/690 |
| 5,349,132 A | * | 9/1994 | Miller et al. ............... 174/35 R |
| 5,358,323 A | * | 10/1994 | Ripley ........................ 312/228 |
| 5,446,618 A | * | 8/1995 | Tetsuya et al. ............. 361/683 |
| 5,697,840 A | * | 12/1997 | Bainbridge et al. ......... 454/184 |
| 5,820,235 A | * | 10/1998 | Tsai ........................ 312/223.2 |
| 5,825,626 A | * | 10/1998 | Hulick et al. ............... 361/724 |
| 5,893,939 A | * | 4/1999 | Rakocy et al. ................ 55/471 |
| 5,964,513 A | * | 10/1999 | Korinsky et al. ......... 312/223.2 |
| 6,027,191 A | * | 2/2000 | Korinsky et al. ........ 312/223.2 |
| 6,039,414 A | * | 3/2000 | Melane et al. ............. 312/205 |
| 6,065,820 A | * | 5/2000 | Fleissner et al. ......... 312/265.5 |
| 6,435,632 B1 | * | 8/2002 | Correa ....................... 312/236 |

FOREIGN PATENT DOCUMENTS

| DE | 92 03 115.3 U1 | 6/1992 | |
| GB | 2069767 A | * 8/1981 | ............ H05K/5/00 |
| WO | WO 9967578 A1 | * 12/1999 | ............ F24F/13/20 |

* cited by examiner

*Primary Examiner*—Peter M. Cuomo
*Assistant Examiner*—Sarah C. Burnham
(74) *Attorney, Agent, or Firm*—Laurence A. Greenberg; Werner H. Stemer; Ralph E. Locher

(57) ABSTRACT

A housing for a telecommunications system is described. The housing contains a housing base for accommodating modules and module frames, and a covering shroud connected releasably to the housing base and, with the housing base, encloses the modules and the module frames. The covering shroud has a casing plate forming at least part of the covering shroud, and plastic moldings connected, in part, to the casing plate and/or the housing base. Some of the plastic moldings can be lined up in a row one beside another to form a wall surface of the covering shroud.

16 Claims, 7 Drawing Sheets

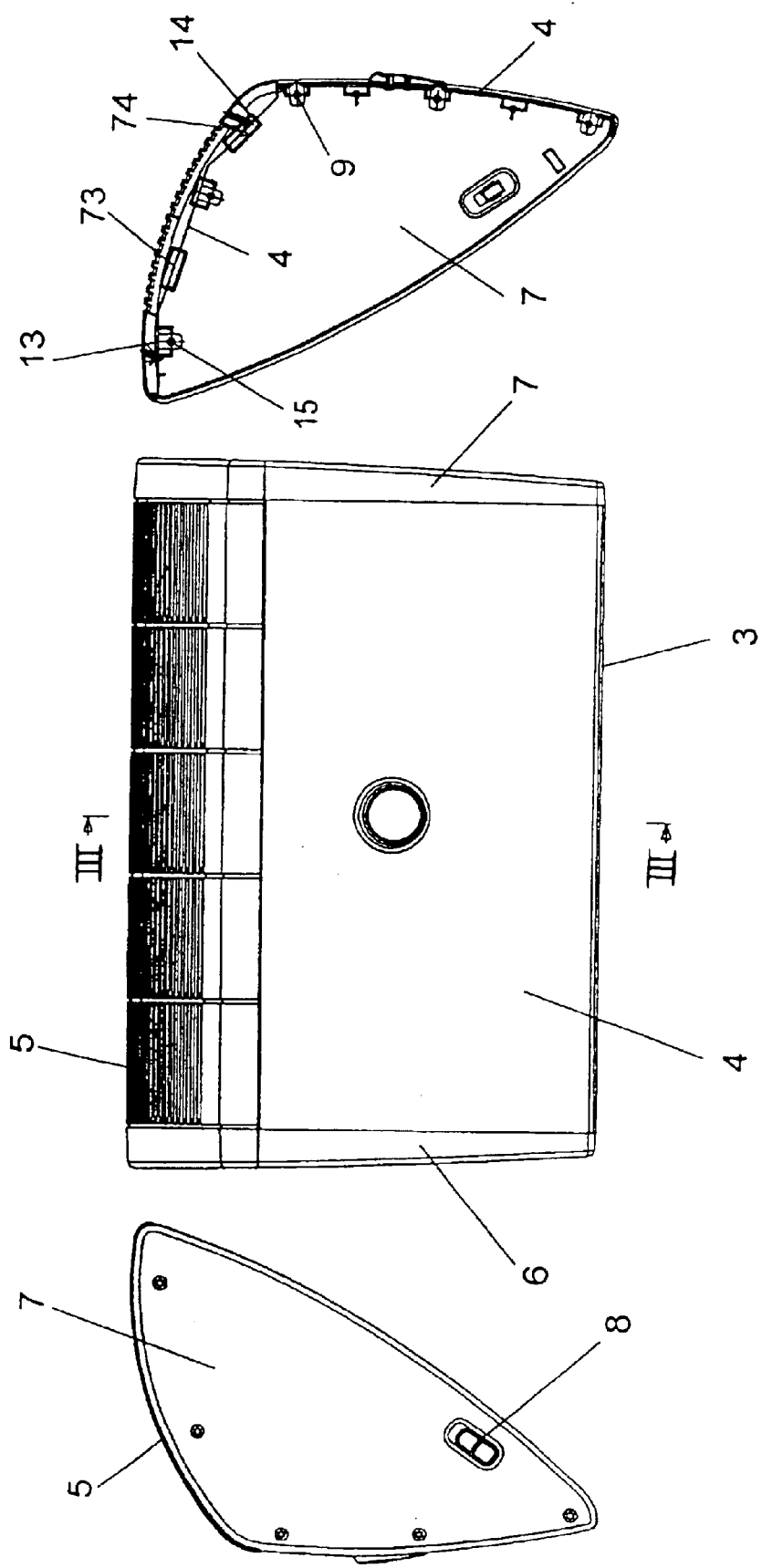

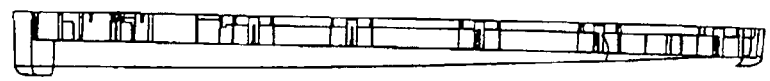
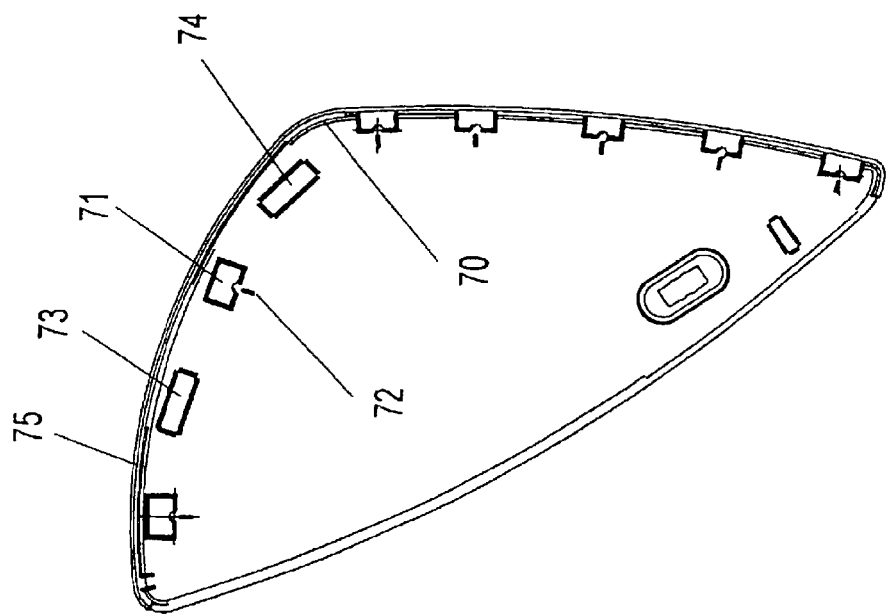
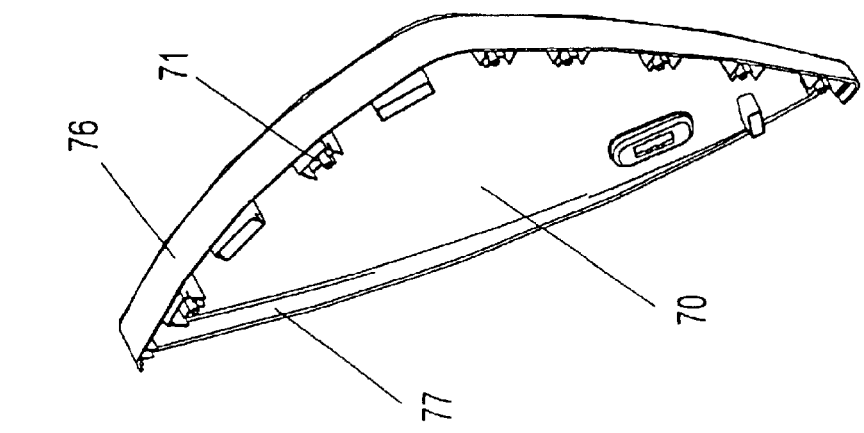

HOUSING FOR A TELECOMMUNICATIONS SYSTEM

BACKGROUND OF THE INVENTION

Field of the Invention

The invention relates to a housing for a telecommunications system having a housing base for accommodating modules or modules frames. The housing further has a covering shroud which is connected releasably to the housing base and with the housing base encloses the modules or the module frames.

German Patent DE 92 03 115 U1 discloses a housing that is intended for a telecommunications system, in particular for a private branch exchange, and has a bottom or base part for accommodating electronic components and terminals as well as a covering shroud that is secured against unauthorized opening. The covering shroud of the housing is drawn in slightly in the central region and, at this location, has a control light panel with lights to indicate the presence of the power supply voltage, the busy state of the lines and the like.

The top end wall of the covering shroud, which is injection molded in a single piece from plastic has ventilation slots which, together with openings in the region of the bottom end wall, allow heat to be discharged. On one longitudinal side, the covering shroud has latching elements which interact with complementary latching elements of the bottom part and lock the covering shroud, once placed in position, on one longitudinal side, while, on the opposite longitudinal side, the bottom part has a resilient blocking hook which is oriented in the direction of the inner wall of the associated covering-shroud side wall and, once the shroud has been pushed on, penetrates into an inner recess of the side wall and blocks the shroud. In order to open the housing, provided in the bottom part of the housing is an opening through which a tool can be introduced and by way of which the blocking hook can be levered out of the recess, with the result that the covering shroud is released.

Such housings for telecommunications systems are usually of a predetermined overall size that is adapted to the number of electric and/or electronic modules, such as a power-supply configuration, printed circuit boards and terminals, which are to be accommodated. The covering shroud, which is formed of plastic and is produced by injection molding, can easily be destroyed by the action of external forces or is of such a thickness, or has additional reinforcing elements, that the volume of the housing is considerably greater than is necessary for accommodating the electric and electronic modules. As a result, there are also limits placed on the size of such housings for telecommunications systems.

Different housing shapes are thus developed for differently sized telecommunications systems, the housing shapes being adapted to the respective number of electric and electronic modules which are to be accommodated. The different housing shapes and sizes require a correspondingly high-outlay production process and high-outlay storage for providing the different product shapes and sizes. Nevertheless, the problems of, in particular, the covering shrouds of the housings for telecommunications systems being easy to destroy and, and with the poor utilization of space due to the thickness of the plastic covering shrouds, remain unsolved.

A further problem is that, in order to secure the housings for telecommunications systems against unintended or unauthorized opening, locking configurations, such as those in German Patent DE 92 03 115 U1, are provided, it only being possible for these to be unlocked, for authorized access, by special tools or with much difficulty. Here too, there is the risk of the plastic covering shroud and/or of the locking parts being destroyed, with the result that corresponding replacements are necessary.

SUMMARY OF THE INVENTION

It is accordingly an object of the invention to provide a housing for a telecommunications system which overcomes the above-mentioned disadvantages of the prior art devices of this general type, which is configured to be stable and to have a pleasing appearance, satisfies all security requirements including securing against unintended and/or unauthorized opening, is of optimum overall size for accommodating electric and electronic modules, and can be produced in different sizes, while maintaining the same construction, at low production and storage costs.

With the foregoing and other objects in view there is provided, in accordance with the invention, a housing for a telecommunications system. The housing contains a housing base for accommodating modules and module frames, and a covering shroud connected releasably to the housing base and, with the housing base, encloses the modules and the module frames. The covering shroud has a casing plate forming at least part of the covering shroud, and plastic moldings connected, in part, to the casing plate and/or the housing base. Some of the plastic moldings can be lined up in a row one beside another to form a wall surface of the covering shroud.

The solution according to the invention makes it possible to provide in different sizes, while maintaining the same construction, a housing for telecommunications systems which satisfies extremely stringent stability requirements and nevertheless allows a pleasing configuration and, on account of its modular construction and/or being capable of modular extension, is associated with low production and storage costs. By virtue of the combination of sheet-steel parts and plastic, the housing according to the invention ensures an extremely high level not just of stability but also of security since the housing is provided with relatively high stability even just by the connection of the sheet-steel parts to the plastic moldings, and this is additionally increased by the shaping and/or profiling of the plastic parts.

In particular the fact that the plastic moldings, which can be lined up in a row one beside the other, are connected, on their inner surfaces, to the outer surfaces of the casing plate provides, according to a further feature of the invention, optimum stability and, furthermore, easy production capability, since the casing plate forms the corresponding installation platform.

The modular configuration of the housing according to the invention can be realized in a variety of different ways. It is thus possible for the plastic moldings, which can be lined up in a row one beside the other, to be identical to each other and for the width of the casing plate to be essentially a whole-numbered multiple of the width of the plastic moldings, which can be lined up in a row one beside the other.

It is alternatively possible for the plastic moldings, which can be lined up in a row one beside the other, to be of the same length but of different widths, the width of the casing plates being essentially equal to the sum of the width of all the plastic moldings, which can be lined up in a row one beside the other.

Finally, it is possible for the width of the plastic moldings to be in each case a whole-numbered multiple of the width of a basic element of the plastic moldings.

Combining plastic moldings and a casing plate in order to produce differently sized covering shrouds further makes it possible to assign to the respective component functions which as a result of the material properties for the relevant component, are particularly suitable for the latter and can thus be easily produced. Thus, according to a further feature of the solution according to the invention, the plastic moldings, which can be lined up in a row one beside the other, have a ventilation grille which can be easily produced, for example, by plastic injection molding and covers openings in the punched casing plate which are located beneath the ventilation grille.

In order to connect the plastic moldings to the casing plate, the plastic moldings, which can be lined up in a row one beside the other, can be secured on the casing plate by resilient hooks, as an installation aid and for alignment of the plastic moldings, which can be lined up in a row one beside the other. Furthermore, the plastic moldings, which can be lined up in a row one beside the other, have fastening pins which can be plugged through fastening lugs in the casing plate, project essentially perpendicularly from the inner surface of the plastic moldings, which can be lined up in a row one beside the other, and onto which resilient nuts can be plugged and which thus connect the plastic moldings to the casing plate.

By virtue of this type of connection, the casing plate, at the same time, is adapted to the shaping of the plastic moldings in that the casing plate is incorporated in the corresponding shape by the resilient nuts being plugged on and arrested in a predetermined position.

According to a further feature of the invention, the plastic moldings, which can be lined up in a row one beside the other, have overlapping surface regions on their mutually facing side edges, with the result that the plastic moldings can be lined up in a row seamlessly one beside the other and a continuous, pleasing configuration, in which the housing is terminated reliably against the penetration of foreign bodies, is provided.

A continuous outer construction and a pleasing configuration are likewise achieved by the further feature of the invention according to which the side parts of the covering shroud, which are likewise configured as plastic moldings, have an upwardly extended border, which covers, in part, the side edge of the casing plate and the respectively outer plastic moldings, which can be lined up in a row one beside the other, and the side parts of the housing base, and are connected to the casing plate via form-fitting elements which are aligned in relation to one another.

In order to secure the covering shroud, and thus the telecommunications-system housing, against unintended and/or unauthorized opening, a further feature of the solution according to the invention provides a slide which is positioned in the surface of the side parts and, for connection to the housing base, engages behind a form-fitting opening of the housing base.

Since the side parts produce the connection to the housing base irrespective of the overall size of the housing, and thus of the number of plastic moldings which are lined up in a row one beside the other, there is optimal locking of the housing in the region of the side parts and, by selection of a slide positioned in the side parts, the locking is also optimal from configuration viewpoints and in respect of security requirements.

As a further measure for securing against unauthorized or unintended opening of the housing, the slide may be provided with an element which blocks the adjustment of the slide and/or the element which blocks the adjustment of the slide may be disposed in the adjustment path of the slide.

In order to align the covering shroud on the housing base, according to a further feature of the invention, a centering contour which projects from the inner surface of the side parts engages, in the installed state of the covering shroud, in a centering slot of the housing base.

Combining plastic moldings with a casing plate produced from sheet steel makes it possible for the casing plate optionally to consist of rolled sheet steel or to be formed from an extruded profile.

In accordance with a concomitant feature of the invention, the plastic moldings, which can be lined up in a row one beside another, are bent in a longitudinal direction.

Other features which are considered as characteristic for the invention are set forth in the appended claims.

Although the invention is illustrated and described herein as embodied in a housing for a telecommunications system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a front-elevational view of a covering shroud of the housing according to FIG. 1a;

FIG. 3 is a sectional view through the covering shroud along lines III—III shown in FIG. 2;

FIG. 4 is a side-elevational view of the covering shroud shown in FIG. 2;

FIG. 13 is a perspective view of a side part of the covering shroud; and

FIG. 14 is a side-elevational view of an inner side of the side part shown in FIG. 13; and FIG. 15 is a sectional view of the side part shown in FIG. 13.

DESCRIPTION OF THE PREFERRED EMBODIMENTS

Figure 1A:
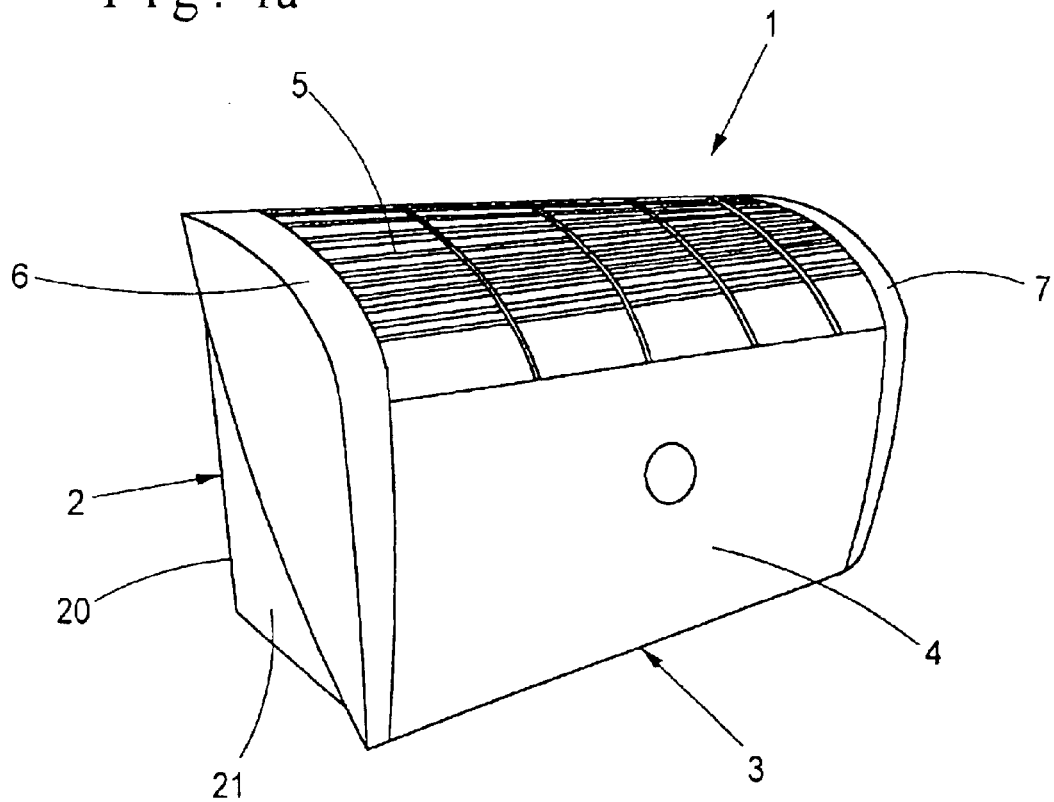
FIGS. 1a and 1b are perspective views of two differently sized, modular-construction housings for telecommunications systems according to the invention.
Figure 1B:
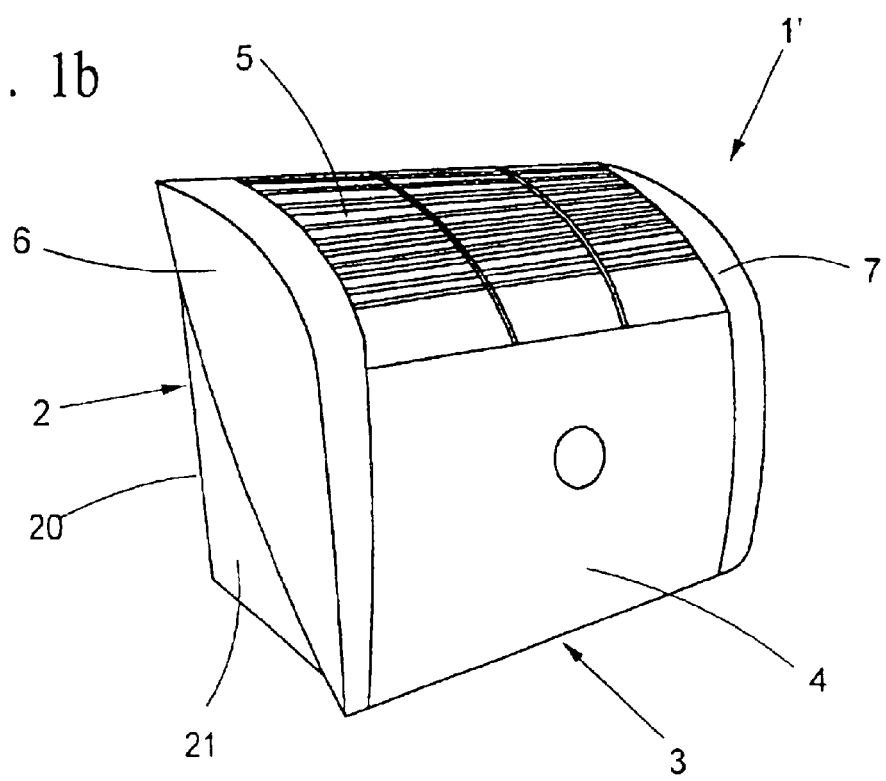

Referring now to the figures of the drawing in detail and first, particularly, to FIGS. 1a and 1b thereof, there is shown a perspective view of two housings 1, 1' for telecommunications systems of different sizes. The two housings 1, 1' are of identical construction, but are of different housing widths, and are intended to illustrate the modular construction of the housing 1, 1' according to the invention for telecommunications systems.

Each of the housings 1, 1' has a housing base 2 with a base part 20 and two side parts 21, 22 (FIG. 5), which preferably is formed from rolled and punched sheet steel or contains an extruded profile. The base part 20 is suitable, in particular, for fastening to a wall and has corresponding fastening devices.

Figure 5:
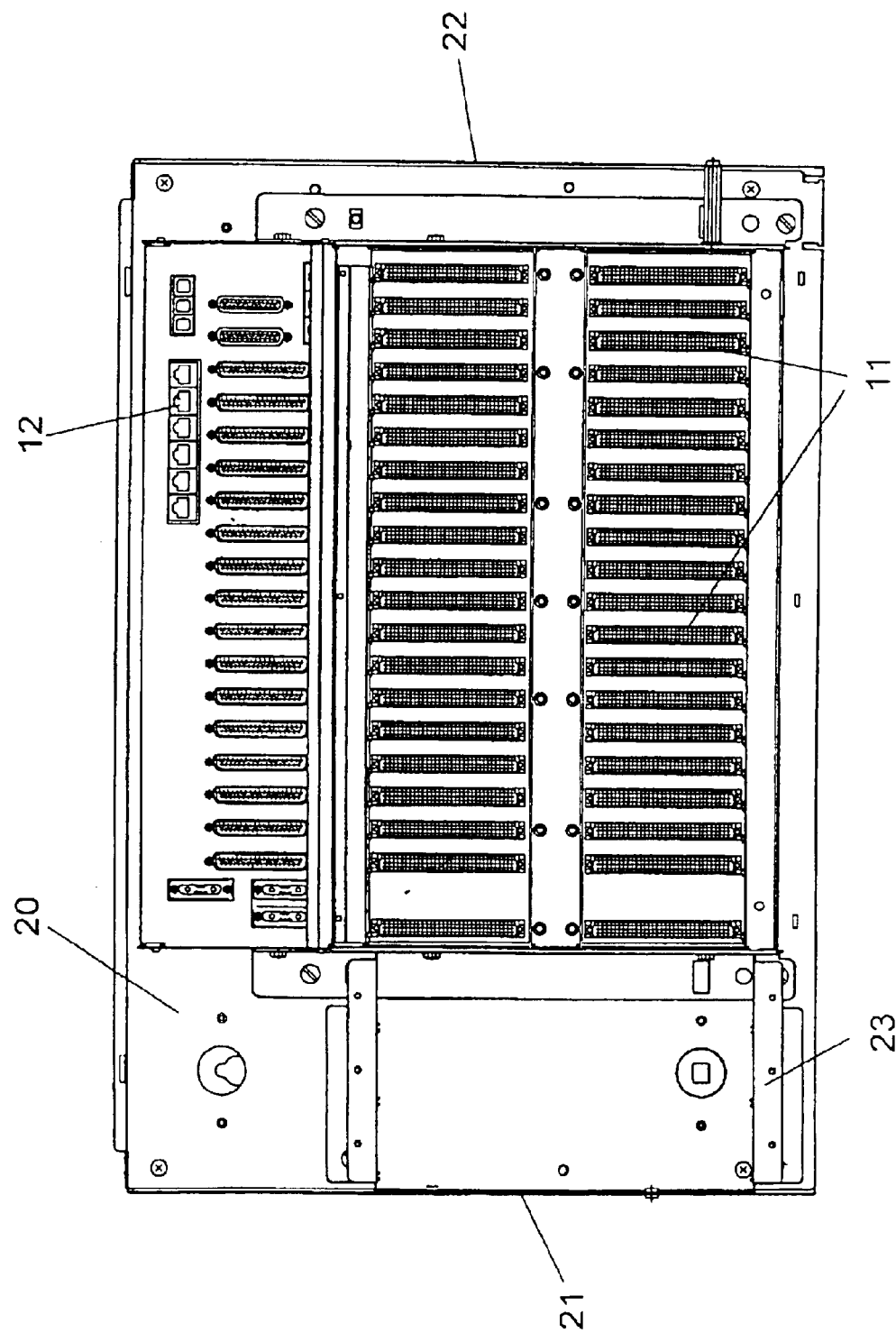
FIG. 5 is a rear-elevational view of a base plate of a housing base with plug-connector mounts and mounts for electric and electronic components.
Figure 6:
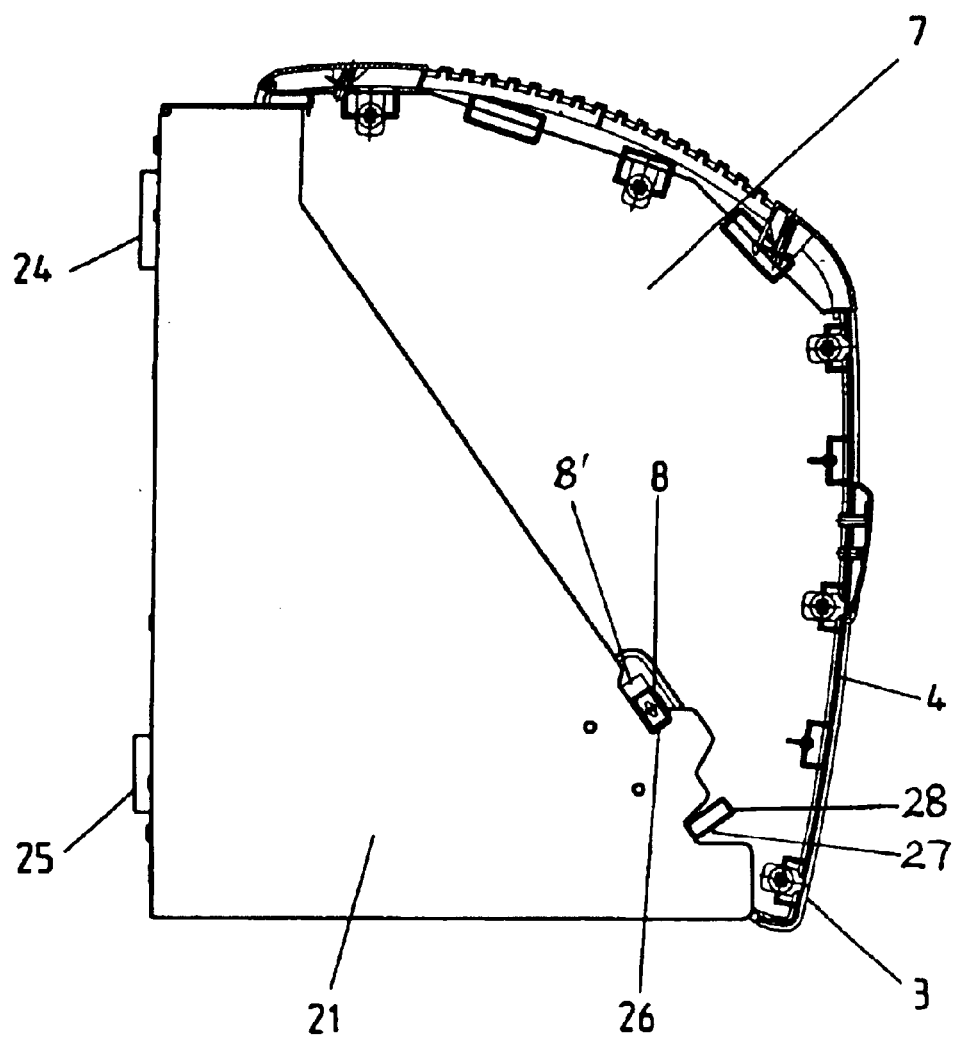
FIG. 6 is a side-elevational view of a side part of the housing base and a side part of the covering shroud in an installed state.

According to FIG. 5, the base part 20 has connected to it a module frame 11, 12, for example a 19-inch or ETSI module frame, for accommodating electric or electronic modules, in particular for plug-in cards with electronic components disposed thereon, plug-in sockets and a securing device 23 for a power-supply configuration. Side plates 21, 22 are disposed laterally on the base plate 20, and of these the side plate 21 is illustrated in FIG. 6. The side plates 21, 22 are connected to the base plate 20 via angle elements 24, 25 and spacer bolts as well as fastening nuts.

In order to cover the subrack or module frame, connected to the base plate 20, or the plug connectors, electric and electronic components and power-supply configurations, use is made of a covering shroud 3 which contains a casing plate 4, plastic moldings 5, which are disposed on a top part of the casing plate 4 and can be lined up in a row one beside the other, and two side parts 6, 7, which are preferably likewise configured as plastic moldings 6, 7.

Depending on the size of the housing, the base plate 20 of the housing base 2 and the casing plate 4 of the covering shroud 3 may be punched from steel sheets of different widths or produced by extrusion and, in conjunction with the plastic moldings 5, which can be lined up in a row one beside the other and form the top side and ventilation grille of the covering shroud 3, allow a modular construction for differently sized housings for telecommunications systems.

FIG. 1a thus shows the housing 1 which is intended for a telecommunications system and of which the width is determined by the five plastic moldings 5 of the covering shroud 3 which are lined up in a row one beside the other, while FIG. 1b shows the smaller housing 1', of which the width is provided by three plastic moldings 5 and ventilation grilles being lined up in a row one beside the other.

In the case of the two housings 1, 1', use is made of the identical side parts 6, 7 for the covering shroud 3 and of the identical side plates 21, 22 for the housing base 2.

The configuration of the covering shroud 3 will be explained in more detail with reference to FIGS. 2 to 4.

FIG. 2 shows a front view of the covering shroud 3 and FIG. 3 shows a section through the covering shroud 3 along the line III—III shown in FIG. 2, which allows the inner construction and the construction relationships to be seen to better effect.

Figure 8:
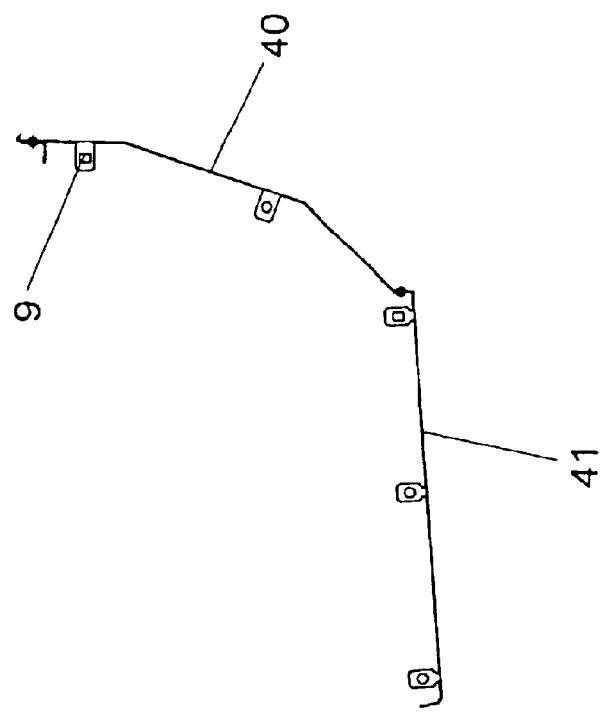
FIG. 8 is a side-elevational view of the casing plate shown in FIG. 7.
Figure 7:
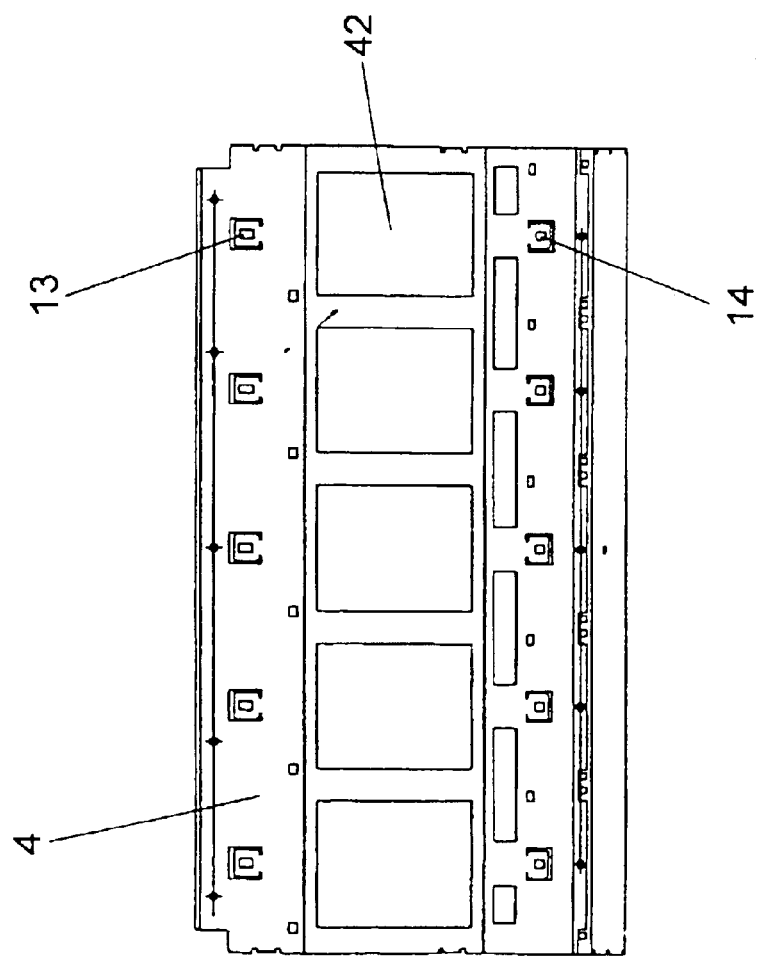
FIG. 7 is a top plan view of a casing plate of the covering shroud shown in FIGS. 2 and 3.
Figure 11:
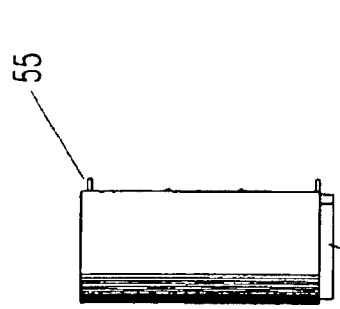
FIG. 11 is a front-elevational view of the plastic molding shown in FIG. 9.

The covering shroud 3 contains the shaping casing plate 4, which according to FIGS. 7 and 8 is made of two parts 40, 41, the casing plate 4 being formed from sheet metal which is rolled or produced and shaped by extrusion. The casing plate 4 has a plurality of fastening lugs 9, 13, 14 for fastening the side parts 6, 7 and the plastic moldings 5, which can be lined up in a row one beside the other. According to FIGS. 7 and 8, the fastening lugs 9, 13, 14 are angled from the casing plate 4, and made to protrude from the casing plate 4, and contain a bore for accommodating fastening pins which project from the inside of the side parts 6, 7 of the covering shroud 3 and/or of the plastic moldings 5, which can be lined up in a row one beside the other.

Figure 9:
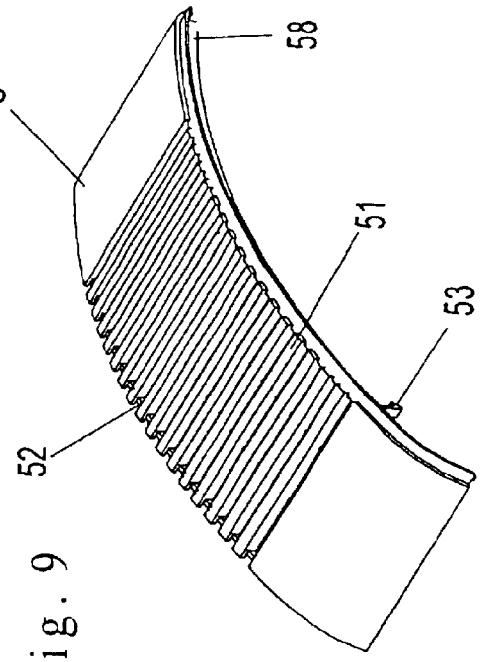
FIG. 9 is a perspective view of a plastic molding, which can be lined up in a row beside other plastic moldings.
Figure 10:
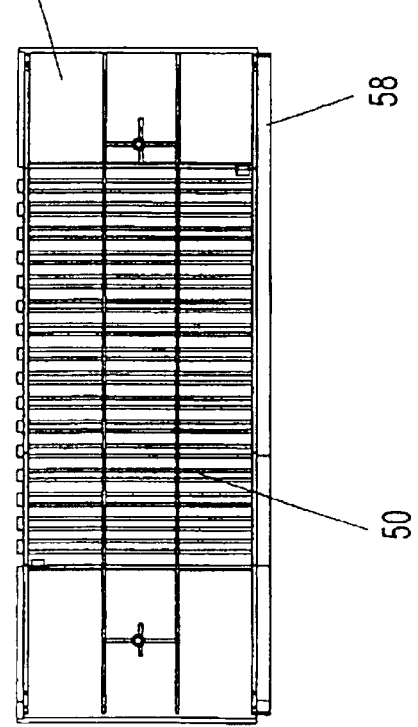
FIG. 10 is a plan view of the plastic molding shown in FIG. 9.
Figure 12:
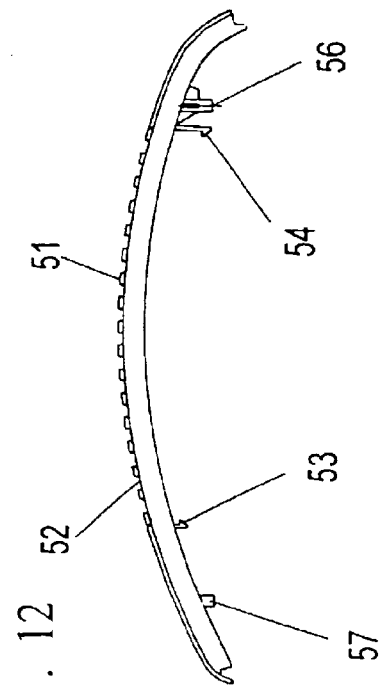
FIG. 12 is a side-elevational view of the plastic molding shown in FIG. 9.

According to FIGS. 9 and 12, the plastic moldings 5, which can be lined up in a row one beside the other, have resilient hooks 53, 54 which project from an inner surface, engage in corresponding openings on the casing plate 4 and serve for positioning the plastic moldings 5, which can be lined up in a row one beside the other.

In order to arrest the covering shroud 3 and connect it to the housing base 2 according to FIG. 1, use is made of a slide 8 on the side parts 6, 7 which, in the arrested state of the covering shroud 3, engages behind an undercut (also referred (to as a form-fitting opening) 26 according to FIG. 6, with the result that the side parts 6, 7, and thus the covering shroud 3, are connected to the side plates 21, 22, and thus to the housing base 2. Also, according to FIG. 6., the covering shroud 3 includes centering contours 28, which project from the side parts 6, 7 into centering slots 27 formed in the sides plates 21, 22 of the housing base 2. In order to secure the locking, it is possible for the slide 8 to be connected to corresponding securing elements or for its position to be secured by corresponding security elements. This prevents the covering shroud 3 from being released in an unintended or unauthorized manner from the housing base 2, and thus the electronic components in the interior of the housing 1 or 1' from being accessible to unauthorized persons.

Such a securing element may contain a corresponding locking device 8' of the slide 8, in which case the locking device can only be opened, for example, by a special tool or requires handling which is only familiar to the person skilled in the art.

As shown in FIG. 6, the housing base has a centering slot 27 formed therein and the covering shroud 3 has a centering contour 28 which, in an installed state of the covering shroud 3, projects from an inner side of the side part 7 and engages in the centering slot 27 of the housing base.

As can be gathered from the plan view of the casing plate 4 according to FIG. 7, the casing plate 4, in the top part of the covering shroud 3, has openings 42 which serve for discharging heat from the electric and electronic components connected to the base plate 20. According to FIGS. 9 to 12, which show the plastic moldings 5, which can be lined up in a row one beside the other, in a perspective view, in a plan view, in a side view and in a front view, the openings 42 are covered by ventilation grilles 50 of the plastic moldings 5, which can be lined up in a row one beside the other. The ventilation grilles 50 are formed by parallel grille crosspieces 51 and opening slots 52, which alternate with one another. The opening slots 52 and grille crosspieces 51 are provided in a region of the plastic moldings 5, which can be lined up in a row one beside the other, which covers the openings 42 in the casing plate 4.

The plastic moldings 5, which can be lined up in a row one beside the other, also have the above-mentioned resilient hooks 53, 54, by which the plastic moldings 5, which can be lined up in a row one beside the other, can be secured on the casing plate 4 during installation. The resilient hooks 53, 54 are preferably disposed on one side border of the plastic moldings 5, or the other, with the result that it is possible for the plastics moldings 5 to be straightforwardly positioned and provisionally secured in position.

In order to connect the plastic moldings 5 to the casing plate 4, use is made of fastening pins 56, 57, which project from the inner surface of the plastic moldings 5, and can be plugged through the openings in the fastening lugs 13, 14 of the casing plate 4. Resilient nuts 15 according to FIG. 3 are positioned on the pins 56, 57, plugged through the fastening lugs 13, 14, and are pushed against the fastening lugs, the resilient nuts 15 cutting into the pins 56, 57 and thus producing a fixed form-fitting and force-fitting connection between the plastic moldings 5 and the casing plate 4.

In order to line up the plastic moldings 5 in a row one beside the other, the plastic moldings 5 have a projecting side border 58, which is covered by the opposite side border of the respectively adjacent plastic molding, this ensuring that the plastic moldings 5 are lined up in a row in a gap-free manner one beside the other in order to produce a continuous ventilation grille. At the same time, the fact that the plastic moldings 5 are lined up in a row one beside the other in an overlapping manner additionally secures the moldings 5 in position and gives the covering shroud 3 a continuous, pleasing appearance.

As a modification to the above described fastening of the plastic moldings 5 on the casing plate 4, it is also possible to provide a single pin, instead of two pins 56, 57, if an end side of the plastic moldings 5 is provided with an undercut, which engages, for example, in a corresponding lug of the casing plate 4 of the covering shroud 3.

The side parts 6, 7 of the covering shroud 3 are connected to the casing plate 4 similarly to the manner in which the plastic moldings 5, which can be lined up in a row one beside the other, are connected to the casing plate 4.

FIG. 13 shows a perspective illustration, and FIG. 14 shows an inner side view and FIG. 15 shows a longitudinal sectional view, of one of the two side parts 6, 7 according to FIG. 2.

The side parts 6, 7 have upwardly extending borders 76, 77 and mounts (also referred to as form-fitting elements) 73, 74 which project from the inner wall and have slots which are adapted to the contour and thickness of the casing plate 4 and by which the side parts 6, 7 are plugged onto the casing plate 4 according to FIG. 3. In order to fasten the side parts 6, 7 on the casing plate 4, use is made of pins 72 integrated in spacer sleeves 71, the spacer sleeves 71 likewise having mounts with slots for connection to the casing plate 4. The pins 72 are plugged through openings in the fastening lugs 9 of the casing plate 4 and are connected to the casing plate 4 by resilient nuts 15 being plugged on and tightened.

A top side edge 75 of the side parts 6, 7 likewise has an undercut, with the result that the side borders of the outer plastic moldings 5 are covered by the side parts 6, 7 and this ensures that the covering shroud 3 has a continuous, pleasing appearance.

The above-described exemplary embodiment may be varied in a variety of different ways. The modular construction of the housing according to the invention for a telecommunications system has been described above with reference to identical plastic moldings, although it is possible for these plastic moldings, in order to increase the variety, to contain different basis elements of different widths.

All the configurations, however, are based on the common idea of connecting sheet-steel parts to plastic moldings, in order to provide an extremely stable and esthetically pleasing housing while, nevertheless achieving easy installation and cost-effective production by combining plastic and metal, the most favorable type of production for the plastic moldings and the sheet-steel parts in each case being selected for the production process. Since in particular the production of shaped parts from metal is extremely costly, the use of plastic moldings for complicated shapes considerably reduces the material-related and production outlay and considerably simplifies production.

We claim:

1. A housing for a telecommunications system, comprising:

a housing base for accommodating modules and module frames; and a covering shroud connected releasably to said housing base and, with said housing base, enclosing the modules and the module frames, said covering shroud having a metal casing plate including a part forming at least part of said covering shroud and said casing plate having at least one opening formed therein, side parts connected, in part, to at least one of said casing plate and said housing base, and plastic moldings directly connected to said part of said casing plate and containing a ventilation grille covering said at least one opening in said casing plate, said plastic moldings to be lined up in a row one beside another in a direction from one of said side parts to the other of said side parts and said part of said casing plate and, said plastic moldings forming a continuous wall surface of said covering shroud.

2. The housing according to claim 1, wherein said casing plate has an outer surface and said plastic moldings which can be lined up in a row one beside another have inner surfaces and are connected, on said inner surfaces, to said outer surface of the casing plate.

3. The housing according to claim 2, wherein said plastic moldings, which can be lined up in a row one beside another have identical configurations, and said casing plate has a width that is substantially a whole-numbered multiple of a width of said plastic moldings, which can be lined up in a row one beside another.

4. The housing according to claim 2, wherein said plastic moldings, which can be lined up in a row one beside another, are all of an equivalent length but have different widths, and said casing plate has a width substantially equal to a sum of the different widths of all of said plastic moldings, which can be lined up in a row one beside another.

5. The housing according to claim 4, wherein a width of said plastic moldings, which can be lined up in a row one beside another, is in each case a whole-numbered multiple of a width a basic element of said plastic moldings, which can be lined up in a row one beside another.

6. The housing according to claim 1, wherein said casing plate has fastening lugs and said plastic moldings, which can be lined up in a row one beside another, each have an inner surface with resilient hooks and fastening pins projecting substantially perpendicular from said inner surface, said plastic moldings, which can be lined up in a row one beside another, are secured on said casing plate by said resilient hooks and said fastening pins which are plugged through said fastening lugs in said casing plate, and are lined up in a row one beside another.

7. The housing according to claim 6, including resilient nuts, and said plastic moldings, which can be lined up in a row one beside another, are connected to said casing plate by said resilient nuts plugged onto said fastening pins.

8. The housing according to claim 1, wherein said plastic moldings, which can be lined up in a row one beside another, have mutually facing side edges with overlapping surface regions on said mutually facing side edges.

9. The housing according to claim 1, wherein said plastic moldings, which can be lined up in a row one beside another, are bent in a longitudinal direction.

10. The housing according to claim 1, wherein:

said casing plate has side edges and lugs;

said plastic moldings, to be lined up in a row one beside another, include outer plastic moldings having projecting side borders, one of said outer plastic moldings on each end of the row;

said housing base has side parts;

said side parts of said covering shroud each having an upwardly extended border arid form-fitting elements, said side parts of said covering shroud form sides of the covering shroud, said upwardly extended border covering in part, said side edges of said casing plate, said outer plastic moldings, and said side parts of said housing base; and said side parts of said covering shroud are connected to said casing plate via said form-fitting elements and said lugs aligned in relation to one another.

11. The housing according to claim 10, wherein:

said housing base has form-fitting openings formed therein; and said side parts of said covering shroud each have a surface and a slide positioned in said surface of said side parts and, for connection to said housing base, said slide engages behind one of said form-fitting openings of the housing base.

12. The housing according to claim 11, wherein said slide contains an element for blocking an adjustment of said slide.

13. The housing according to claim 11, wherein said slide can be connected to an element that blocks an adjustment of said slide.

14. The housing according to claim 10, wherein said housing base has a centering slot formed therein and including a centering contour which, in an installed state of said covering shroud, projects from an inner side of said side parts and engages in a centering slot of said housing base.

15. The housing according to claim 1, wherein said casing plate is formed of rolled sheet steel.

16. The housing according to claim 1, wherein said casing plate is an extruded profile.

* * * * *